(12) United States Patent
Woo et al.

(10) Patent No.: US 11,287,992 B2
(45) Date of Patent: Mar. 29, 2022

(54) CONTROLLER AND STORAGE DEVICE INCLUDING CONTROLLER AND NONVOLATILE MEMORY DEVICES

(71) Applicant: SAMSUNG ELECTRONICS CO., LTD., Suwon-si (KR)

(72) Inventors: Seonghoon Woo, Hwaseong-si (KR); Soon Suk Hwang, Ansan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 60 days.

(21) Appl. No.: 16/793,584

(22) Filed: Feb. 18, 2020

(65) Prior Publication Data

US 2020/0183600 A1     Jun. 11, 2020

Related U.S. Application Data

(63) Continuation of application No. 15/804,226, filed on Nov. 6, 2017, now Pat. No. 10,564,876.

(30) Foreign Application Priority Data

Nov. 29, 2016 (KR) .................. 10-2016-0160785

(51) Int. Cl.
| | | |
|---|---|---|
| *G11C 29/00* | (2006.01) | |
| *G06F 3/06* | (2006.01) | |
| *G06F 11/10* | (2006.01) | |
| *G06F 13/28* | (2006.01) | |
| *G11C 29/04* | (2006.01) | |
| *G11C 29/52* | (2006.01) | |

(52) U.S. Cl.
CPC ............ *G06F 3/0635* (2013.01); *G06F 3/064* (2013.01); *G06F 3/0611* (2013.01); *G06F 3/0688* (2013.01); *G06F 11/1048* (2013.01); *G06F 11/1068* (2013.01); *G06F 13/28* (2013.01); *G11C 29/52* (2013.01); *G11C 2029/0411* (2013.01)

(58) Field of Classification Search
CPC .... G06F 3/064; G06F 3/0688; G06F 11/1048; G11C 29/52; G11C 2029/0411
See application file for complete search history.

(56) References Cited

U.S. PATENT DOCUMENTS

| | | | | |
|---|---|---|---|---|
| 6,009,014 A * | 12/1999 | Hollmer | ............. | G11C 16/0483 365/185.22 |
| 6,028,788 A * | 2/2000 | Choi | .................. | G11C 16/0483 365/185.11 |
| 6,285,587 B1 * | 9/2001 | Kwon | .................... | G11C 16/24 365/185.11 |
| 7,679,133 B2 | 3/2010 | Son et al. | | |
| 8,041,884 B2 * | 10/2011 | Chang | .................... | G11C 16/10 711/103 |
| 8,553,466 B2 | 10/2013 | Han et al. | | |

(Continued)

*Primary Examiner* — Esaw T Abraham
(74) *Attorney, Agent, or Firm* — Sughrue Mion, PLLC

(57) ABSTRACT

A storage device includes nonvolatile memory devices arranged in groups, and a controller connected with the groups respectively through channels. The controller is configured to generate an access request for a nonvolatile memory device among the nonvolatile memory devices, and transmit, based on the access request, access requests respectively to two or more groups, among the groups, respectively through two or more channels, among the channels.

20 Claims, 14 Drawing Sheets

(56) References Cited

U.S. PATENT DOCUMENTS

| | | | |
|---|---|---|---|
| 8,559,235 B2 * | 10/2013 | Yoon | G11C 16/3445 |
| | | | 365/185.29 |
| 8,566,505 B2 | 10/2013 | Kilzer et al. | |
| 8,654,587 B2 * | 2/2014 | Yoon | H01L 27/11582 |
| | | | 365/185.18 |
| 8,694,754 B2 * | 4/2014 | Schuette | G06F 3/0629 |
| | | | 711/202 |
| 8,966,205 B1 | 2/2015 | Lo et al. | |
| 9,043,531 B2 | 5/2015 | Calvert et al. | |
| 9,092,647 B2 | 7/2015 | Circello et al. | |
| 9,229,854 B1 * | 1/2016 | Kuzmin | G06F 11/1072 |
| 9,449,659 B2 * | 9/2016 | Brewer | G06F 12/0811 |
| 9,606,916 B2 | 3/2017 | Lee et al. | |
| 9,740,657 B2 | 8/2017 | Lee | |
| 10,037,150 B2 | 7/2018 | Margo et al. | |
| 2004/0268088 A1 | 12/2004 | Lippincott et al. | |
| 2009/0121271 A1 | 5/2009 | Son et al. | |
| 2009/0259800 A1 | 10/2009 | Kilzer et al. | |
| 2011/0216603 A1 | 9/2011 | Han et al. | |
| 2011/0233648 A1 | 9/2011 | Zong et al. | |
| 2012/0051143 A1 | 3/2012 | Yoon et al. | |
| 2013/0067138 A1 | 3/2013 | Schuette et al. | |
| 2013/0080732 A1 | 3/2013 | Nellans et al. | |
| 2013/0279262 A1 | 10/2013 | Yoon et al. | |
| 2014/0281149 A1 | 9/2014 | Roberts et al. | |
| 2015/0046636 A1 | 2/2015 | Seo et al. | |
| 2015/0058529 A1 * | 2/2015 | Lin | G06F 3/0679 |
| | | | 711/103 |
| 2015/0378816 A1 | 12/2015 | Kawamura et al. | |
| 2016/0011969 A1 | 1/2016 | Lin et al. | |
| 2016/0062883 A1 | 3/2016 | Byun | |
| 2016/0246712 A1 * | 8/2016 | Vucinic | G06F 12/0646 |
| 2017/0134325 A1 * | 5/2017 | Apfelbaum | H04L 47/70 |
| 2017/0285992 A1 | 10/2017 | Vogt | |

\* cited by examiner

CONTROLLER AND STORAGE DEVICE INCLUDING CONTROLLER AND NONVOLATILE MEMORY DEVICES

CROSS-REFERENCE TO RELATED APPLICATION

This is a continuation application of U.S. patent application Ser. No. 15/804,226, filed Nov. 6, 2017, and issued as U.S. Pat. No. 10,564,876, on Feb. 18, 2020, in the U.S. Patent and Trademark Office, which claims priority from Korean Patent Application No. 10-2016-0160785, filed on Nov. 29, 2016, in the Korean Intellectual Property Office, the disclosure of which is incorporated herein by reference in its entirety.

BACKGROUND

1. Field

Apparatuses consistent with example embodiments relate to a semiconductor device, and more particularly, to a controller and a storage device including the controller and nonvolatile memory devices.

2. Description of Related Art

A storage device refers to a device that stores data under control of a host device, such as a computer, a smartphone, or a smart pad. The storage device includes a device, which stores data on a magnetic disk, such as a hard disk drive (HDD), or a device, which stores data on a semiconductor memory, i.e., a nonvolatile memory, such as a solid state drive (SSD) or a memory card.

The nonvolatile memory includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), etc.

The operating speed of the host device, which communicates with the storage device, such as a computer, a smartphone, or a smart pad is improved as semiconductor manufacturing technologies develop. Furthermore, the size of content used in the storage device and a host device of the storage device is increasing. For this reason, the storage device with improved operating speed is being continuously demanded.

SUMMARY

According to example embodiments, a storage device includes nonvolatile memory devices arranged in groups, and a controller connected with the groups respectively through channels. The controller is configured to generate an access request for a nonvolatile memory device among the nonvolatile memory devices, and transmit, based on the access request, access requests respectively to two or more groups, among the groups, respectively through two or more channels, among the channels.

According to example embodiments, a controller includes management blocks configured to communicate with external nonvolatile memory devices through channels, and a channel split block configured to receive an access request for a nonvolatile memory device among the external nonvolatile memory devices, the access request including a physical address of a unit length, and transmit, based on the received access request, access requests for requesting a communication of data of a size smaller than the unit length, respectively to two or more management blocks of the management blocks.

According to example embodiments, a storage device includes nonvolatile memory devices arranged in groups, and a controller connected with the groups respectively through channels. The controller is configured to form a super channel including a first channel and a second channel of the channels, and associate and simultaneously access a first memory block of the first channel and a second memory block of the second channel, the first memory block and the second memory block having similar operating characteristics.

According to example embodiments, a controller including a channel split block configured to receive a first access command comprising a first physical address of a unit length, the first physical address comprising a first block address of a first memory block of one of first nonvolatile memory devices, and split the received first access command to a second access command and a third access command, the second access command comprising a second physical address of a split length less than the unit length, the second physical address comprising the first block address, the third access command comprising a third physical address of the split length, the third physical address comprising a second block address of a second memory block of one of second nonvolatile memory devices. The controller further includes a first management block configured to transmit the second access command to the one of the first nonvolatile memory devices through a first channel, and a second management block configured to transmit the third access command to the one of the second nonvolatile memory devices through a second channel forming a super channel with the first channel.

DETAILED DESCRIPTION

Figure 1:
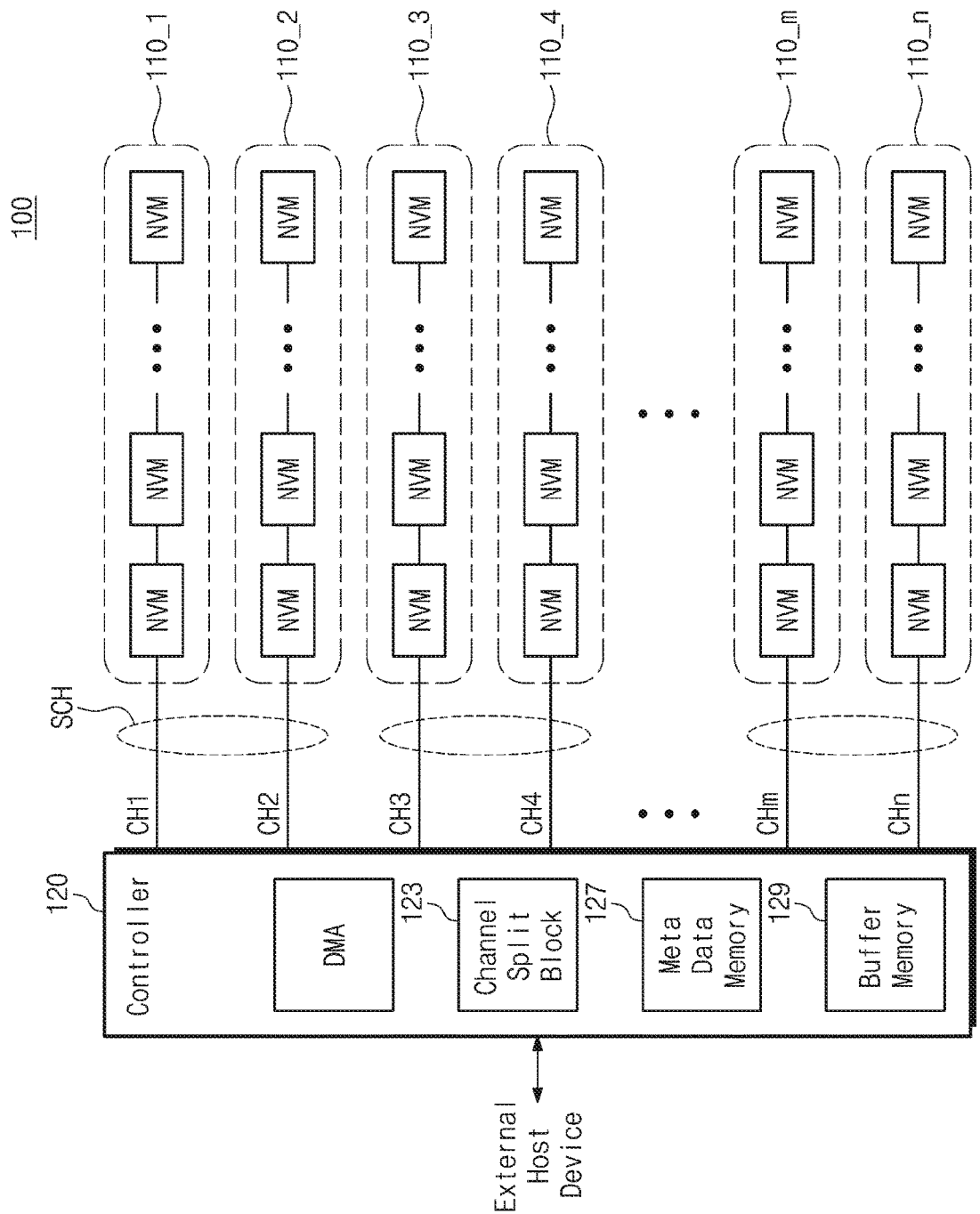
FIG. 1 is a block diagram illustrating a storage device, according to an example embodiment.

FIG. 1 is a block diagram illustrating a storage device 100, according to an example embodiment. Referring to FIG. 1, the storage device 100 includes a plurality of nonvolatile memory devices NVM and a controller 120.

The nonvolatile memory devices NVM may have the same or different types. The nonvolatile memory devices NVM may form a plurality of groups 110_1 to 110_n. Each of the groups 110_1 to 110_n may include one or more nonvolatile memory devices NVM. The groups 110_1 to 110_n may be connected with the controller 120 through a plurality of channels CH1 to CHn, respectively.

The controller 120 may be connected with the groups 110_1 to 110_n of the nonvolatile memory devices NVM through the channels CH1 to CHn, respectively. The controller 120 may communicate with an external host device. The controller 120 may access the nonvolatile memory devices NVM, based on a request of the external host device or a request generated according to an internal schedule.

The controller 120 may control the channels CH1 to CHn, independently. For example, the controller 120 may access the nonvolatile memory devices NVM of the second group 110_2 connected with the second channel CH2 regardless of whether the nonvolatile memory devices NVM of the first group 110_1 connected with the first channel CH1 are being accessed. The controller 120 may alternately access nonvolatile memory devices of one group connected with one channel. For example, the controller 120 may start to access the second nonvolatile memory device NVM (e.g., the second nonvolatile memory device from a right side of FIG. 1) of the first channel CH1 after an access to the first nonvolatile memory device NVM (e.g., the first nonvolatile memory device from the right side of FIG. 1) is completed.

In each channel, the controller 120 may be connected with the nonvolatile memory devices NVM through common data lines and common control lines. In each channel, the controller 120 may be connected with the nonvolatile memory devices NVM through individual ready/busy signal lines and individual chip select signal lines. Each of the ready/busy signal lines may be used to transmit a ready/busy signal indicating a busy state in which the corresponding nonvolatile memory device NVM cannot receive data or a command/address or a ready state in which the corresponding nonvolatile memory device NVM is capable of receiving data or a command/address. Each of the chip select signal lines may be used to transmit a chip select signal for selecting one of the nonvolatile memory devices NVM of the corresponding group.

The controller 120 includes a direct memory access DMA, a channel split block 123, a metadata memory 127, and a buffer memory 129.

The direct memory access DMA is used for the controller 120 to exchange data with the nonvolatile memory devices NVM or the external host device. For example, the controller 120 may program (or set) information of a target to which data will be conveyed, a location (e.g., an address) of data to be conveyed, and the size of data to be conveyed, in the direct memory access DMA. The direct memory access DMA may communicate with the nonvolatile memory devices NVM or the external host device, based on the program or set information. The controller 120 may perform any other task while the direct memory access DMA performs communication. If the communication is completed, the direct memory access DMA may notify the controller 120 that the communication is completed, through an interrupt.

The channel split block 123 may manage a super channel SCH. The channel split block 123 may set (or allocate or group) two or more channels to one super channel. The channel split block 123 may split an access request corresponding to a logical address of a unit length or a physical address of the unit length into second access requests corresponding to the number of channels included in the super channel SCH. The channel split block 123 may transmit the second access requests to respective channels in the super channel SCH.

The metadata memory 127 may store metadata that are used for the controller 120 to manage the nonvolatile memory devices NVM. For example, the metadata memory 127 may store map data including mapping information between logical addresses and physical addresses and association information indicating how the nonvolatile memory devices NVM of groups connected to channels arranged as the super channel SCH are associated with each other. The map data and the association information may be stored in each of the nonvolatile memory devices NVM, and may be loaded onto the metadata memory 127 from the nonvolatile memory devices NVM at power-on or when the map data and the association information are used. The metadata memory 127 is illustrated as being included in the controller 120, but the metadata memory 127 may be provided on the outside of the controller 120. For example, the metadata including the map data and the association information may be stored in an internal memory or an external memory of the controller 120 or may be distributed and stored in both the internal and external memories of the controller 120.

The buffer memory 129 may be used to temporarily store data (e.g., user data to be accessed by a user) that the controller 120 conveys to an external host device and data that the controller 120 conveys to the nonvolatile memory devices NVM. The buffer memory 129 is illustrated as being included in the controller 120, but the buffer memory 129 may be provided on the outside of the controller 120.

In an example embodiment, when at least part of the metadata is stored outside of the controller 120, and the buffer memory 129 is provided outside of the controller 120, the at least part of the metadata may be stored in the buffer memory 129 together with data (e.g., user data to be accessed by the user).

An example embodiment is illustrated in FIG. 1 as two channels are arranged as one super channel SCH. However, the number of channels arranged as one super channel SCH may not be limited thereto. For example, three or more channels may be arranged as one super channel SCH.

An example embodiment is illustrated in FIG. 1 as adjacent channels are arranged as one super channel SCH. However, example embodiments may not be limited to the case in which adjacent channels are arranged as one super channel SCH. Channels that are spaced apart from each other by a different channel or super channel SCH may be arranged as one super channel SCH.

Figure 2:
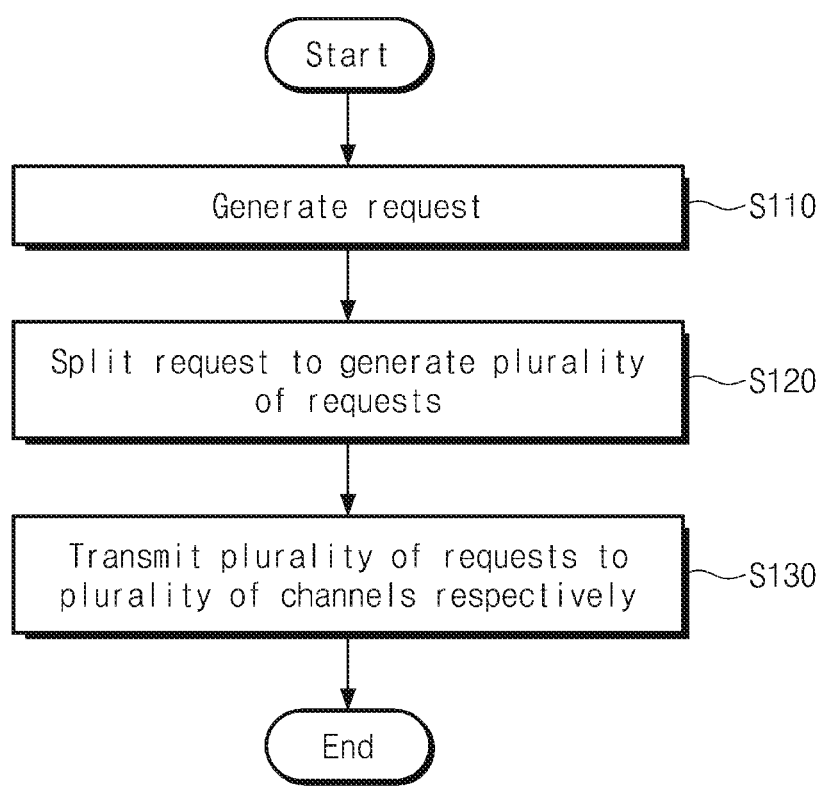
FIG. 2 is a flowchart illustrating an operating method of a storage device or a controller, according to an example embodiment.

FIG. 2 is a flowchart illustrating an operating method of the storage device 100 or the controller 120, according to an example embodiment. Referring to FIGS. 1 and 2, in operation S110, the controller 120 generates a request (e.g., an access request). For example, the controller 120 may generate a request, based on a request from an external host device or an internal schedule. The generated request may be a read request or a write request. The generated request may include a command and an address (e.g., a logical address or a physical address) of a nonvolatile memory device selected from the nonvolatile memory devices NVM. The address of the generated request may target a nonvolatile memory device NVM of a channel (e.g., one super channel SCH or one of channels belonging to one super channel SCH).

In operation S120, the controller 120 splits the generated request to generate a plurality of second requests. Each of the second requests may include a command and an address. A type (e.g., read or write) of the command of each of the second requests may be the same as a type of the generated request. The addresses of the second requests may target nonvolatile memory devices of different channels belonging to one super channel SCH.

The size of data that are requested to be read or to be written by each of the second requests may be smaller than the size of data that are requested to be read or to be written by the generated request. For example, the size of data that are requested by each of the second requests may correspond to a value that is obtained by dividing the size of data requested by the generated request by the number of channels of a super channel SCH.

In operation S130, the controller 120 transmits the second requests to a plurality of channels respectively. For example, the controller 120 may transmit the second requests to some of the channels CH1 to CHn, for example, channels belonging to one super channel SCH.

Figure 3:
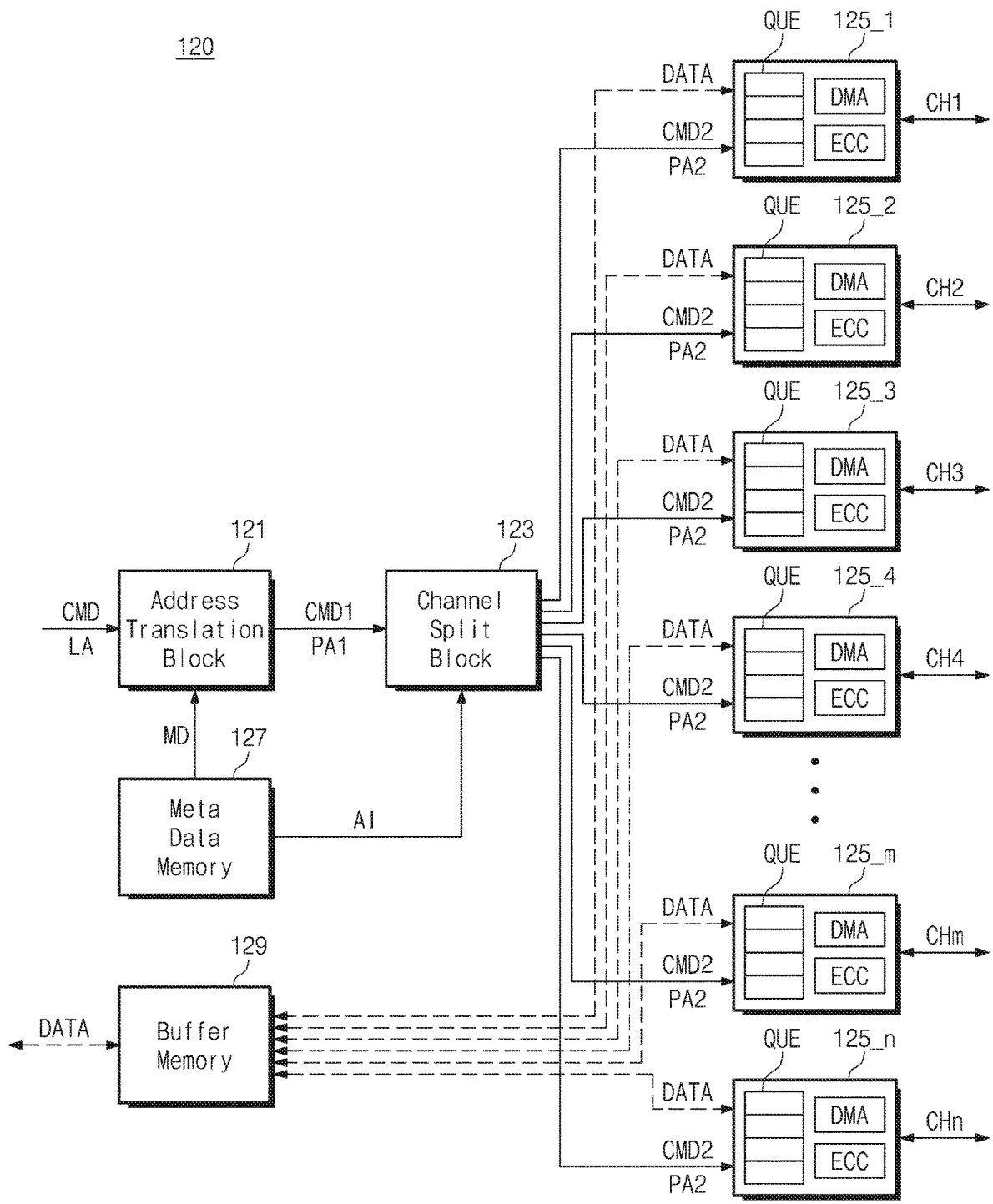
FIG. 3 is a block diagram illustrating a controller, according to an example embodiment.

FIG. 3 is a block diagram illustrating the controller 120, according to an example embodiment. Referring to FIGS. 1 and 3, the controller 120 includes an address translation block 121, the channel split block 123, a plurality of management blocks 125_1 to 125_n, the metadata memory 127, and the buffer memory 129.

The address translation block 121 may receive a request that includes a command CMD and a logical address LA. For example, the request received by the address translation block 121 may be received from an external host device. The address translation block 121 may translate a logical address LA into a first physical address PA1 with reference to map data MD stored in the metadata memory 127. An example of the map data is illustrated in FIG. 4.

Figure 4:
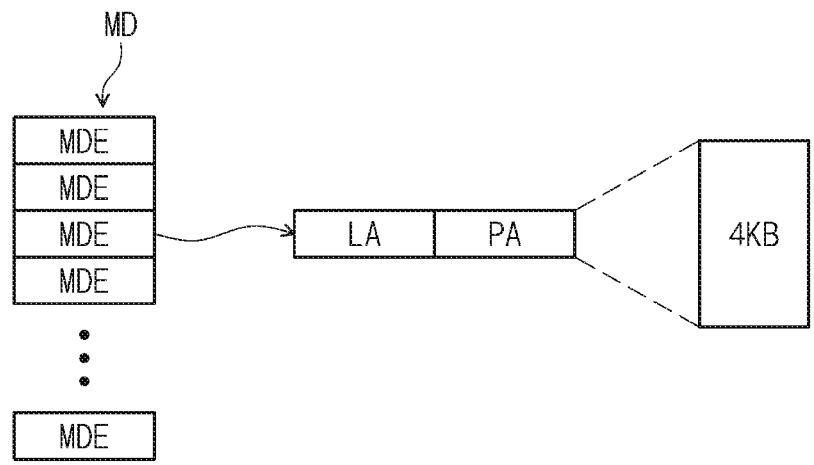
FIG. 4 is a diagram illustrating map data, according to an example embodiment.

FIG. 4 is a diagram illustrating map data MD, according to an example embodiment. Referring to FIGS. 3 and 4, the map data MD includes a plurality of map data entities MDE. Each map data entity MDE may correspond to a basic unit by which mapping information of a logical address and a physical address is stored. Each map data entity MDE may store translation information between consecutive logical addresses LA of the unit length and consecutive physical addresses PA of the unit length. For example, the unit length may be 4 KB. That is, each map data entity MDE may include translation information (or mapping information) between a consecutive logical address range, in which data of a 4 KB length are stored, and a consecutive physical address range, in which data of a 4 KB length are stored. For example, each map data entity MDE may include start addresses and end addresses of a consecutive logical address range and a consecutive physical address range.

Referring again to FIG. 3, the address translation block 121 may translate a logical address LA into the first physical address PA1 in units of the map data entity MDE, that is, the unit length. The first physical address PA1 may be output together with a first command CMD1 to request a read or write operation on data corresponding to the unit length. That is, the address translation block 121 may output a read request or a write request of the unit length.

The channel split block 123 receives the first command CMD1 and the first physical address PA from the address translation block 121. The channel split block 123 may split the received first command CMD1 to generate second commands CMD2 and may split the received first physical address PA1 to generate second physical addresses PA2. For example, when the first physical address PA1 targets one super channel SCH, the channel split block 123 may generate the second commands CMD2 and the second physical addresses PA2 corresponding to the number of channels belonging to a selected super channel SCH. The second commands CMD2 may have the same type (e.g., read or write) as the first command CMD1. The channel split block 123 may generate second physical addresses PA2 from the first physical address PA1 with reference to association information AI stored in the metadata memory 127.

Figure 5:
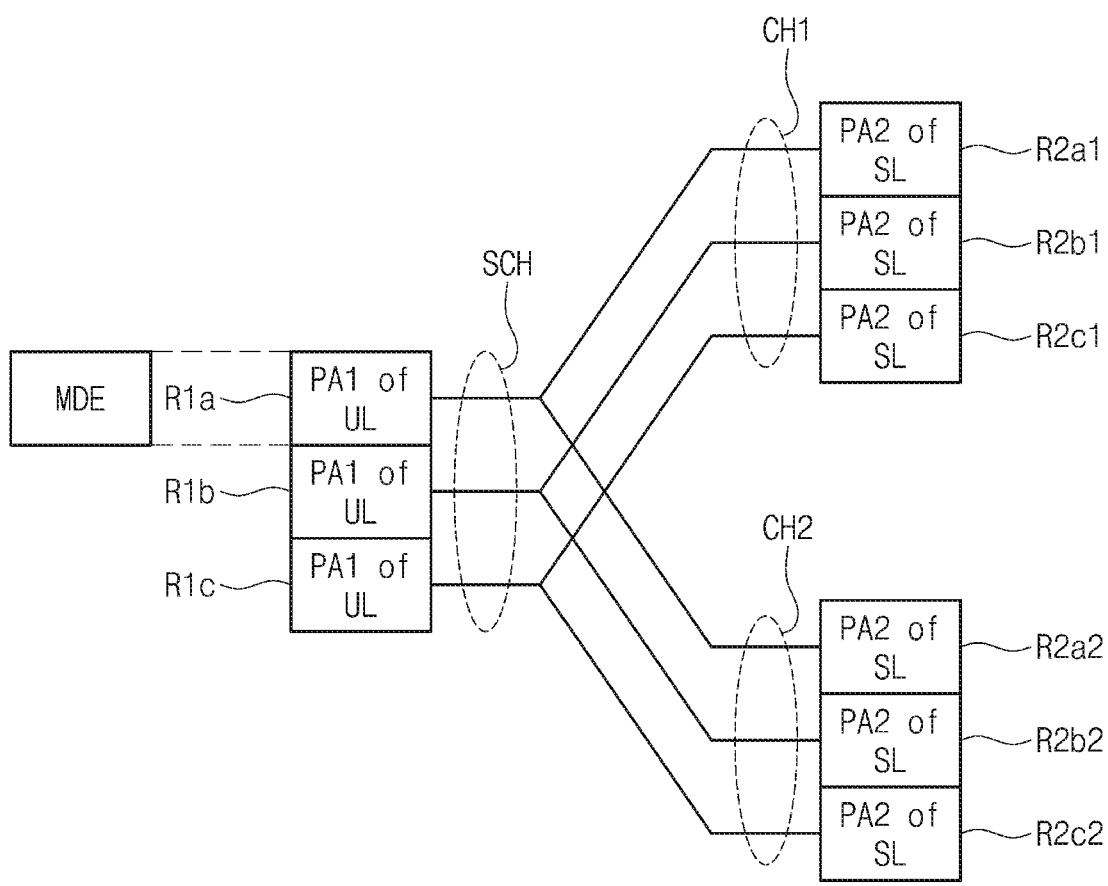
FIG. 5 is a diagram illustrating a channel split block generating second physical addresses from a first physical address, according to an example embodiment.

An example in which the channel split block 123 generates the second physical addresses PA2 from the first physical address PA1 is illustrated in FIG. 5.

FIG. 5 is a diagram illustrating the channel split block 123 generating the second physical addresses PA2 from the first physical address PA1, according to an example embodiment. In FIG. 5, in an example embodiment, the first physical address PA1 and the second physical addresses PA2 are described with reference to the first channel CH1 and the second channel CH2.

Referring to FIGS. 3 and 5, channels belonging to a super channel SCH may not be individually distinguished by the address translation block 121. Accordingly, if a request targeting the super channel SCH is generated, the address translation block 121 may translate a unit length UL corresponding to one map data entity MDE with respect to the super channel SCH. For example, each of first requests R1$a$, R1$b$, and R1$c$ translated by the address translation block 121 may include the first physical address PA1 of the unit length UL. That is, each of the first requests R1$a$, R1$b$, and R1$c$ may cause a read or write of data corresponding to the unit length UL.

The channel split block 123 may split the first requests R1$a$, R1$b$, and R1$c$ on the super channel SCH into second requests R2$a$1, R2$a$2, R2$b$1, R2$b$2, R2$c$1, and R2$c$2 on the first and second channels CH1 and CH2. The second requests R2$a$1 and R2$a$2 split from the first request R1$a$ may be transmitted to the first and second channels CH1 and CH2, respectively. The second requests R2$b$1 and R2$b$2 split from the first request R1$b$ may be transmitted to the first and second channels CH1 and CH2, respectively. The second requests R2$c$1 and R2$c$2 split from the first request R1$c$ may be transmitted to the first and second channels CH1 and CH2, respectively.

Each of the second physical addresses PA2 of the second requests R2$a$1, R2$a$2, R2$b$1, R2$b$2, R2$c$1, and R2$c$2 has a split length SL that is smaller than the unit length UL. For example, the split length SL may correspond to a value that is obtained by dividing the unit length UL by the number of channels CH1 and CH2 belonging to the super channel SCH. The second requests R2$a$1, R2$a$2, R2$b$1, R2$b$2, R2$c$1, and R2$c$2 may be split and transferred to the first and second channels CH1 and CH2, based on a preset association information AI. If the first requests R1a, R1b, and R1c are split into the second requests R2a1, R2a2, R2b1, R2b2, R2c1, and R2c2, based on the association information AI, the split may be made regardless of a map data entity MDE. Accordingly, it is possible to access the nonvolatile memory device NVM in units of the split length SL, which is smaller than the unit length UL corresponding to one map data entity, without increasing the size of the map data by using the super channel SCH and the association information AI. That is, an input/output unit (or access unit) of the nonvolatile memory device NVM may decrease without overhead such as an increase in the size of map data MD.

Returning to FIG. 3, the management blocks 125_1 to 125_n may correspond to the channels CH1 to CHn, respectively. Each of the management blocks 125_1 to 125_n may receive a second request including the second command CMD2 and the second physical address PA2 from the channel split block 123. Each of the management blocks 125_1 to 125_n may exchange data with the buffer memory 129.

Each of the management blocks 125_1 to 125_n includes a queue QUE, an error correction block ECC, and a direct memory access DMA. The queue QUE may be an access queue or a command queue. The queue QUE may enqueue the second command CMD2 transmitted from the channel split block 123. The queue QUE may select and output one of the enqueued second commands CMD2, based on a first-in first-out (FIFO) scheme or an internal scheduling algorithm. Each of the management blocks 125_1 to 125_n may program (or set) the direct memory access DMA in response to the second command CMD2 from the queue QUE. For example, in the case of a write operation, each of the management blocks 125_1 to 125_n may program the DMA such that each of the management blocks 125_1 to 125_n outputs data stored in the buffer memory 129 to a selected nonvolatile memory device NVM of the corresponding channel. In the case of a read operation, each of the management blocks 125_1 to 125_n may program the direct memory access DMA to read data from the selected nonvolatile memory device NVM of the corresponding channel and to store the read data in the buffer memory 129. For example, a read queue for a read command and a write queue for a write command may be integrated or provided separately.

The error correction block ECC may perform error correction encoding and decoding operations. For example, the error correction block ECC may perform the error correction encoding operation on data to be output to the corresponding channel. The error correction block ECC may perform the error correction decoding operation on data received from the corresponding channel.

The buffer memory 129 may operate as a temporary memory between the external host device and the nonvolatile memory devices NVM. In an example embodiment, the management blocks 125_1 to 125_n may include error correction blocks ECC having different error correction algorithms. The management blocks 125_1 to 125_n may output commands of different types to the nonvolatile memory devices NVM.

Figure 6:
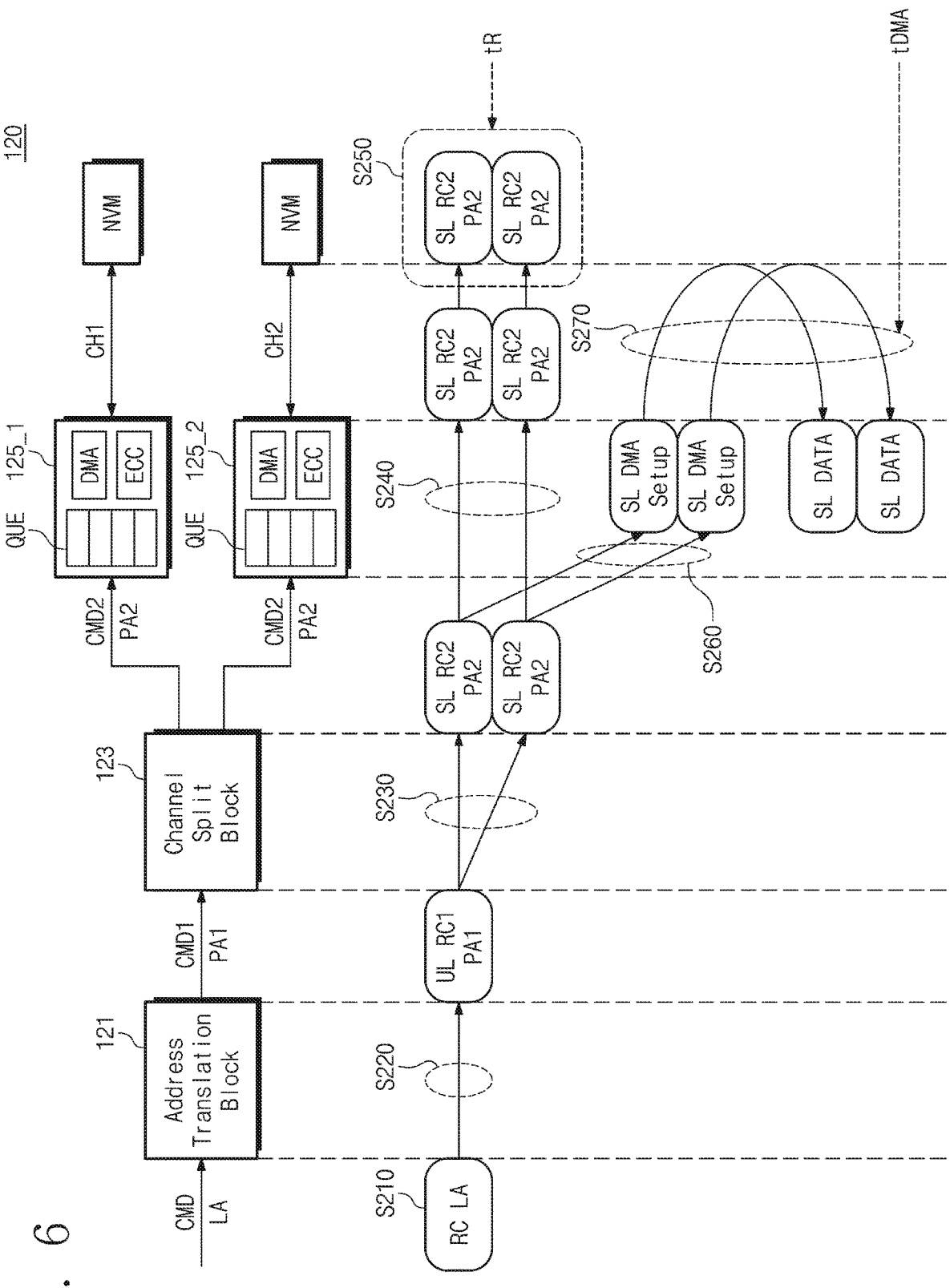
FIG. 6 is a diagram illustrating a command being processed in the controller of FIG. 3.

FIG. 6 is a diagram illustrating a command being processed in the controller 120 of FIG. 3. For example, an example in which a command is processed is described with reference to the first and second channels CH1 and CH2.

Referring to FIGS. 3 and 6, in operation S210, the address translation block 121 receives a read command RC and a logical address LA from the external host device. In operation S220, the address translation block 121 performs address translation with reference to the map data MD. The address translation block 121 outputs a first read command RC1 to request data of the unit length UL and the first physical address PA1 indicating the data of the unit length UL as a first request. The unit length UL may be a length of consecutive addresses translated by the map data entity MDE (refer to FIG. 4).

In operation S230, the channel split block 123 performs channel split with reference to the association information AI. The channel split block 123 transmits a second read command RC2 to request data of the split length SL smaller than the unit length UL and the second physical address PA2 indicating data of the split length SL to each of the first and second management blocks 125_1 and 125_2. In operation S230, one read command for the data of the unit length UL is split into two parallel read commands for the split length SL smaller than the unit length UL.

In operation S240, in response to the second read command RC2, the first and second management blocks 125_1 and 125_2 output the second read commands RC2 and the second physical addresses PA2 to the first and second channels CH1 and CH2, respectively. The second read commands RC2 and the second physical addresses PA2 may be respectively transmitted to the nonvolatile memory device NVM, which is selected by the first management block 125_1, of the nonvolatile memory devices NVM of the first group 110_1 (refer to FIG. 1) and the nonvolatile memory device NVM, which is selected by the second management block 125_2, of the nonvolatile memory devices NVM of the second group 110_2.

In operation S250, the selected nonvolatile memory devices NVM respectively perform read operations, based on the second physical addresses PA2. A time used to perform the read operation may be a read time tR.

In operation S260, in response to the second read commands RC2, each of the first and second management blocks 125_1 and 125_2 sets up or programs the direct access memory DMA after the second read commands RC2 and the second physical addresses PA2 are output and a preset time elapses. The first and second management blocks 125_1 and 125_2 may be set up or programmed to read data corresponding to the split length SL from the selected nonvolatile memory devices NVM, respectively.

In operation S270, if the direct memory access DMA is completely set up or programmed, the direct memory accesses DMA reads data of the split length SL from the selected nonvolatile memory devices NVM through the first and second channels CH1 and CH2, respectively.

A time that is used for each direct memory access DMA to read data from the selected nonvolatile memory device NVM may be a DMA time tDMA.

In conventional storage devices, a bottleneck of execution of the read operation may be the read time tR. However, there has been a sharp decrease in the read time tR by consistently improving the performance of nonvolatile memory devices. The read time tR of some nonvolatile memory devices appears to be shorter than the DMA time tDMA. In a storage device in which the nonvolatile memory devices are used, the bottleneck of execution of the read operation may be the DMA time tDMA, not the read time tR.

According to example embodiments, the channel split block 123 splits a first access request of the unit length UL into second access requests of the split length SL. The second access requests are processed in parallel by a plurality of direct memory accesses DMA in a plurality of channels in one super channel. Because the size of data that each direct memory access DMA will process is smaller than the unit length UL, the DMA time tDMA may decrease.

In FIG. 6, an example embodiment is described with reference to the read command. However, the example embodiment is equally applied to a write command. A write command of the unit length UL is scattered and transmitted to channels belonging to the super channel SCH with reference to the association information AI.

Example embodiments may be applicable to an operation in which write commands and read commands are combined and used. For example, a read reclaim operation of moving data of a first storage space to a second storage space and a garbage collection operation of moving valid data of the first storage space to the second storage space may be performed with reference to the association information AI to be similar to that described with reference to FIG. 6. For example, the read reclaim operation and the garbage collection operation may be performed by repeating read and write operations based on the procedure described with reference to FIG. 6, except operation S210 associated with the logical address LA is not performed.

In an example embodiment, the management blocks that belong to one super channel SCH may exchange information indicating whether a current operation is completed, with each other. It is assumed that read operations or write operations are performed according to read commands or write commands in the first and second management blocks 125_1 and 125_2. When a current operation (e.g., a read operation or a write operation) of each of the management blocks 125_1 and 125_2 belonging to one super channel SCH is completed, each of the management blocks 125_1 and 125_2 may transmit a signal, which indicates that an operation is completed, to other management blocks or core logic or firmware of the controller 120. The core logic or firmware of the controller 120 may process the corresponding read command or write command as being completed, when all the management blocks 125_1 and 125_2 belonging to one super channel SCH complete read operations or write operations associated with one read command or one write command.

Figure 7:
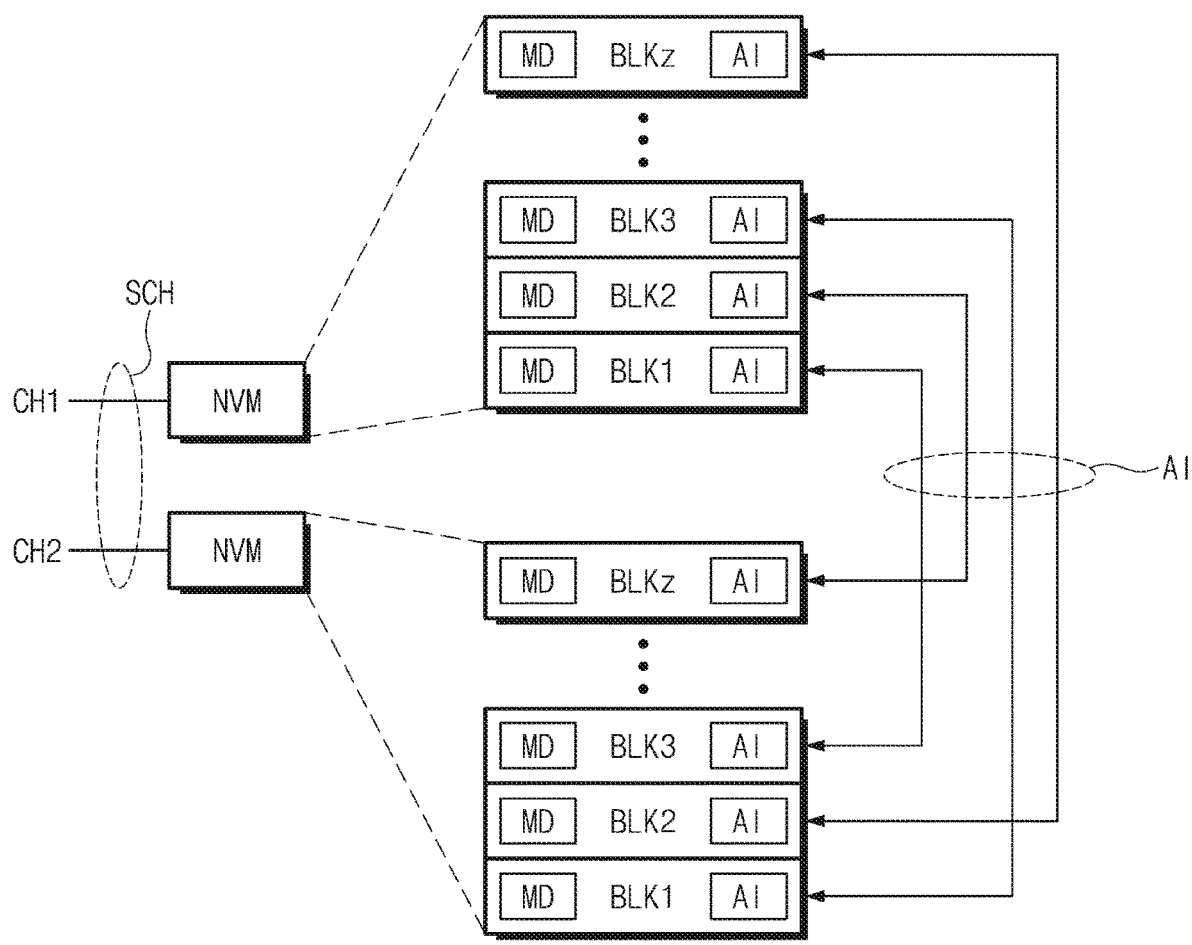
FIG. 7 is a diagram illustrating nonvolatile memory devices belonging to different channels in a super channel and being associated in units of a memory block, according to an example embodiment.

FIG. 7 is a diagram illustrating the nonvolatile memory devices NVM belonging to different channels in the super channel SCH and being associated in units of a memory block, according to an example embodiment. Referring to FIG. 7, each nonvolatile memory device NVM includes a plurality of memory blocks BLK1 to BLKz. The nonvolatile memory devices NVM that belong to different channels CH1 and CH2 in one super channel SCH are associated with each other in units of a memory block.

For example, the first memory block BLK1 of the first channel CH1 may be associated with the third memory block BLK3 of the second channel CH2. The second memory block BLK2 of the first channel CH1 may be associated with the z-th memory block BLKz of the second channel CH2. The third memory block BLK3 of the first channel CH1 may be associated with the first memory block BLK1 of the second channel CH2. The z-th memory block BLKz of the first channel CH1 may be associated with the second memory block BLK2 of the second channel CH2.

Each memory block stores the map data MD and the association information AI associated with its own storage space. For example, the association information AI may include information indicating how a memory block is associated with another memory block. The association information AI may be included in physical block information PBI showing a physical state of each memory block, for management.

Figure 8:
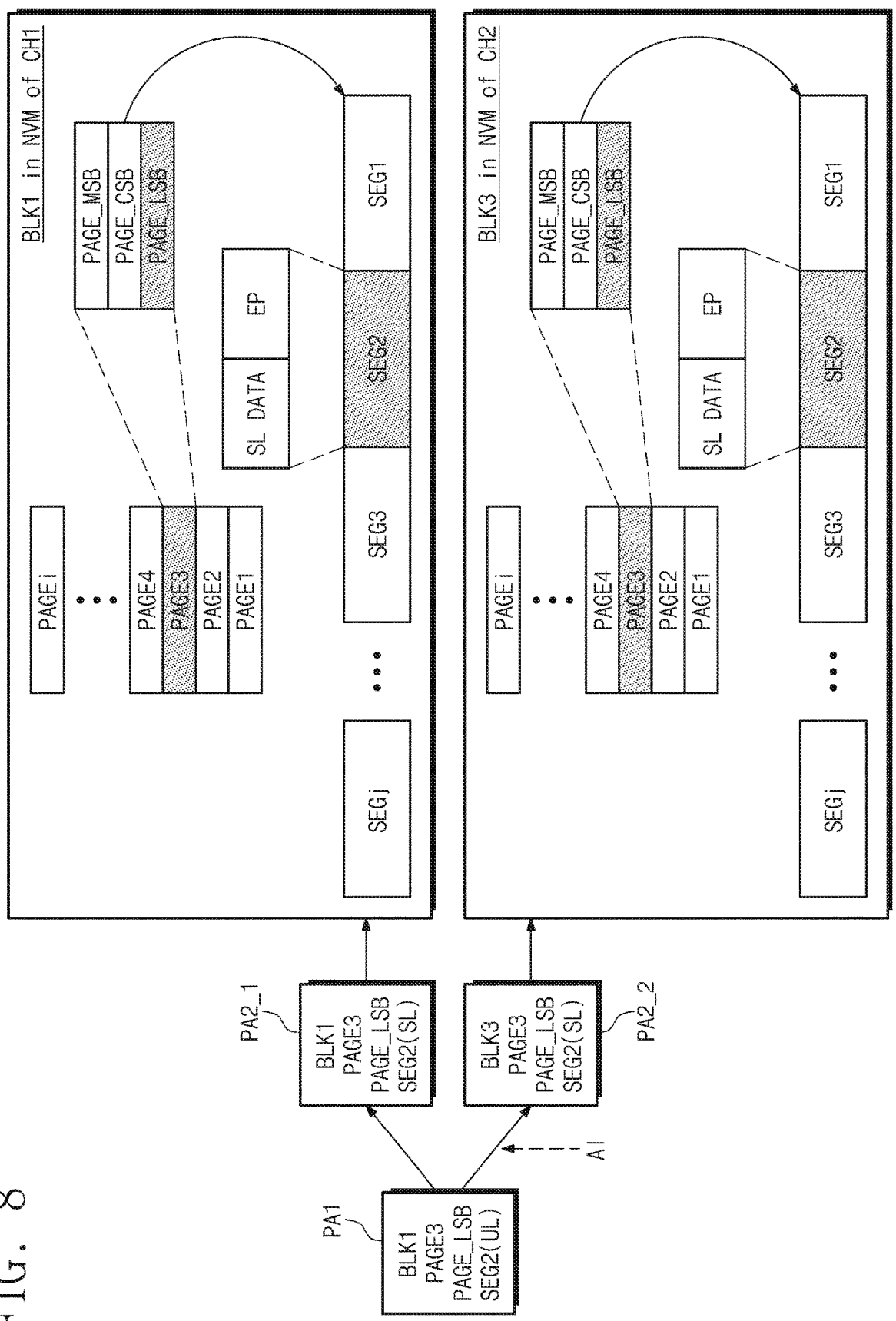
FIG. 8 is a diagram illustrating memory blocks of nonvolatile memory devices belonging to different channels in the same super channel and being accessed, according to an example embodiment.

FIG. 8 is a diagram illustrating memory blocks of the nonvolatile memory devices NVM belonging to different channels in the same super channel SCH and being accessed, according to an example embodiment. Referring to FIGS. 3 and 8, an example in which the first memory block BLK1 belonging to the first channel CH1 and the third memory block BLK3 belonging to the second channel CH2 are accessed is illustrated. Each memory block may include a plurality of pages PAGE1 to PAGEi. Each of the pages PAGE1 to PAGEi may include a least significant bit (LSB) page PAGE_LSB, a central significant bit (CSB) page PAGE_CSB, and a most significant bit (MSB) page PAGE_MSB. For example, the first bit that is programmed in each memory cell of each page may be a most significant bit MSB, and most significant bits MSBs may be arranged in the MSB page PAGE_MSB. The second bit that is programmed in each memory cell of each page may be a central significant bit CSB, and central significant bits CSBs may be arranged in the CSB page PAGE_CSB. The third bit that is programmed in each memory cell of each page may be a least significant bit LSB, and least significant bits LSBs may be arranged in the LSB page PAGE_LSB. If the number of bits programmed in each memory cell of each page increases, the number of sub-pages belonging to each page may also increase. The first, second and third bits do not intend to limit an order of program in which the first, second and third bits are programmed.

Each management block may access each sub-page in a unit of a segment SEG. For example, the size of one segment SEG may be smaller than the size of one sub-page. That is, a plurality of segments SEG1 to SEGj may be written in one sub-page. Each segment may include data and error correction parity EP. As described with reference to FIG. 6, when an access unit of each management block is the split unit SL, data of each segment may correspond to the split unit SL. That is, the size of one segment SEG and the size of one split unit SU may be the same. The error correction parity EP may be added when an error correction encoding operation is performed by the error correction block ECC.

As another example embodiment, each management block may access each sub-page in units of two or more segments. That is, the size of one split unit SU may correspond to the size of two or more segments. For example, when data is written in or read from each management block, each management block may split data in units of a segment, and may perform an error correction encoding operation or an error correction decoding operation on each split segment. In still another example embodiment, each management block may perform an access operation in units of a sub-page. That is, the size of one split unit SU and the size of one sub-page may be the same.

The address translation block 121 may generate a first access request that includes the first physical address PA1. For example, the first physical address PA1 may indicate the first memory block BLK1, the third page PAGE3 of the first memory block, the LSB page PAGE_LSB of the third page PAGE3, and the second segment SEG2 of the LSB page PAGE_LSB corresponding to the unit length UL.

The channel split block 123 may generate second physical addresses PA2_1 and PA2_2 corresponding to the first and second channels CH1 and CH2 from the first physical address PA1. For example, the channel split block 123 may equally apply the first physical address PA1 to one channel (e.g., the first channel CH1), and the channel split block 123 may change the unit length UL to the split unit SL and may generate the second physical address PA2_2. The channel split block 123 may use the same address as that of one channel CH1 and may change a target memory block (e.g., the third memory block BLK3) with reference to the association information AI. That is, if the second physical addresses PA2 associated with a page are fixed to be the same as the first physical address PA1, the association information AI may include only information about association between the memory blocks BLK1 and BLK3. Accordingly, the size of the association information AI may decrease, and the overhead due to the association information AI may decrease.

For example, when an access is performed in units of two or more segments, the first physical address PA1 may indicate two or more segments. The second physical addresses PA2_1 and PA2_2 may have the same segment address as a segment address of the first physical address PA1. When an access is performed in units of a sub-page, the first physical address PA1 may not include a segment address. The second physical addresses PA2_1 and PA2_2 may not also include segment addresses. In another example embodiment, the first physical address PA1 and the second physical addresses PA2_1 and PA2_2 may not include any information of the segments SEG1 to SEGj. The first and second physical addresses may indicate information of target sub-page and information of whether full page read/write or half/quarter page read/write is used. Each management block may perform the error correction encoding or decoding in units of the segments SEG1 to SEGj regardless of the unit length UL and the split length SL.

With regard to the association information AI, a way and a plane may be further considered. The way may be used to distinguish nonvolatile memory devices NVM connected to the same channel. For example, in FIG. 1, the first nonvolatile memory device NVM (the first nonvolatile memory device from a left side of FIG. 1) may correspond to a first way. The second nonvolatile memory device NVM (the second nonvolatile memory device from the left side of FIG. 1) may correspond to a second way. A way may be fixed or changed upon splitting the first physical address PA1 into the second physical addresses PA2. In the case in which the way is changed, way information may be included in the association information AI. In the case in which the way is fixed, for example, ways of the second physical addresses PA2 may be the same as a way of the first physical address PA1.

Each nonvolatile memory device NVM may include a plurality of planes. Each of the planes may include a plurality of memory blocks. Memory blocks of different planes may operate independently of each other and may be grouped to a super block to operate together. When memory blocks of different planes operate while the memory blocks are grouped to a super block, the association information AI may not include plane information. When memory blocks of different planes are not grouped to a super block, a plane may be fixed or changed upon splitting the first physical address PA1 into the second physical addresses PA2. In the case in which a plane is changed, plane information may be included in the association information AI. In the case in which the plane is fixed, for example, planes of the second physical addresses PA2 may be the same as a plane of the first physical address PA1.

In an example embodiment, when the first physical address PA1 is split into the second physical addresses PA2_1 and PA2_2, both a block address and page and sub-page addresses may change in the second physical addresses PA2_1 and PA2_2. The association information AI may include information about addresses that change in the second physical addresses PA2_1 and PA2_2.

Figure 9:
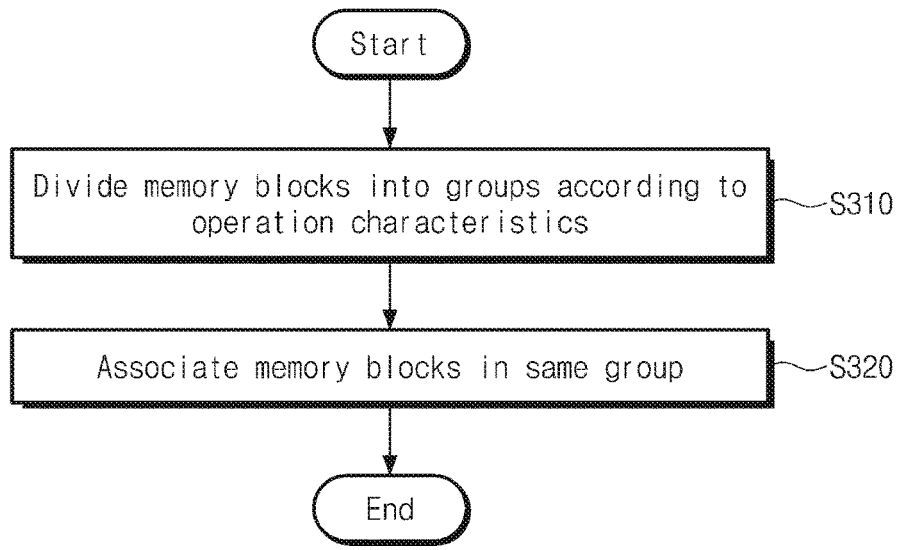
FIG. 9 is a flowchart illustrating a method of associating memory blocks, according to an example embodiment.

FIG. 9 is a flowchart illustrating a method of associating memory blocks, according to an example embodiment. Referring to FIGS. 1, 7, and 9, in operation S310, the controller 120 divides a plurality of memory blocks into characteristic groups, according to operation characteristics. For example, memory blocks of the nonvolatile memory devices NVM belonging to the first group 110_1 of the first channel CH1 may be divided into first to k-th characteristic groups based on operating characteristics. Also, memory blocks of the nonvolatile memory devices NVM belonging to the second group 110_2 of the second channel CH2 may be divided into first to k-th characteristic groups based on operating characteristics. The operating characteristics may include any one or any combination of a read time, a bit error rate, a read history, a program and erase count, a wear level, an erase time, an erase history, a program time, and a program history.

In operation S320, the controller 120 associates memory blocks in the same characteristic group. For example, a memory block, which belongs to first characteristic group, of memory blocks corresponding to the first channel CH1 may be associated with a memory block, which belongs to the first characteristic group, of memory blocks corresponding to the second channel CH2. Likewise, a memory block, which belongs to a k-th characteristic group, of the memory blocks corresponding to the first channel CH1 may be associated with a memory block, which belongs to the k-th characteristic group, of the memory blocks corresponding to the second channel CH2.

If memory blocks belonging to the same characteristic group are associated with each other by the super channel SCH, a delay due to a difference between operating characteristics in a read or write operation may be prevented.

Figure 10:
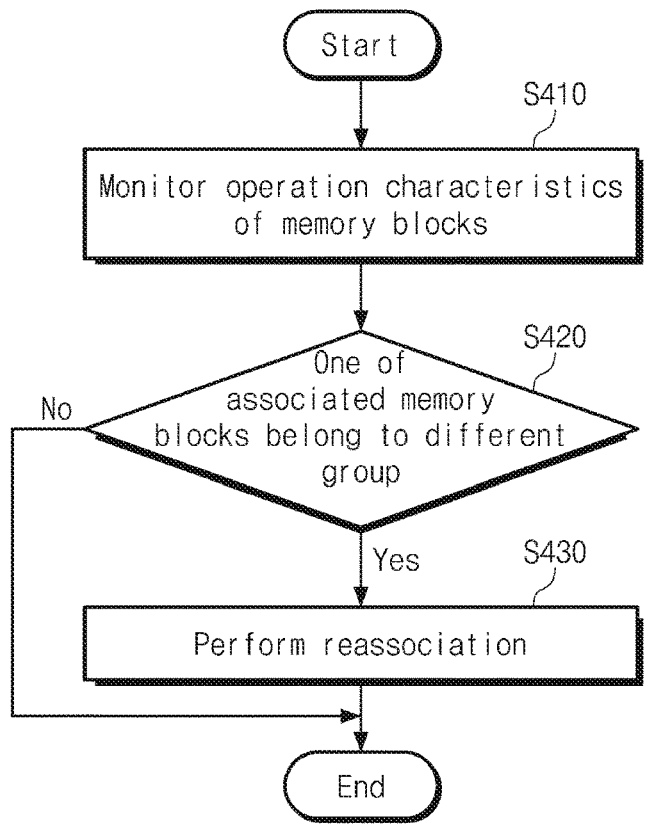
FIG. 10 is a flowchart illustrating a method of replacing one of associated memory blocks, according to an example embodiment.

FIG. 10 is a flowchart illustrating a method of replacing one of associated memory blocks, according to an example embodiment. Referring to FIGS. 1, 7, and 10, in operation S410, the controller 120 monitors operation characteristics of memory blocks. For example, the controller 120 may monitor a change in operating characteristics of memory blocks under the following condition: (i) periodically, (ii) when a read error or a write error is generated, (iii) when a read or write operation is performed, or (iv) according to the number of times that a read or write operation is performed.

In operation S420, the controller 120 determines whether one of associated memory blocks belongs to a different characteristic group. If it is determined that one of associated memory blocks does not belong to a different characteristic group, the associated memory blocks may be maintained. If it is determined that one of associated memory blocks belongs to a different characteristic group, the process proceeds to operation S430.

In operation S430, the controller 120 performs reassociation. For example, memory blocks of a different group, to which one of associated memory blocks become belonging, may be a reassociation target. The controller 120 may release an association relationship between memory blocks corresponding to the reassociation target and may reassociate the memory blocks corresponding to the reassociation target with different memory blocks of the corresponding group. For example, the reassociation may be performed when it is unnecessary to move data, for example, when memory blocks corresponding to the reassociation target are at an erase state or are invalid blocks.

Figure 11:
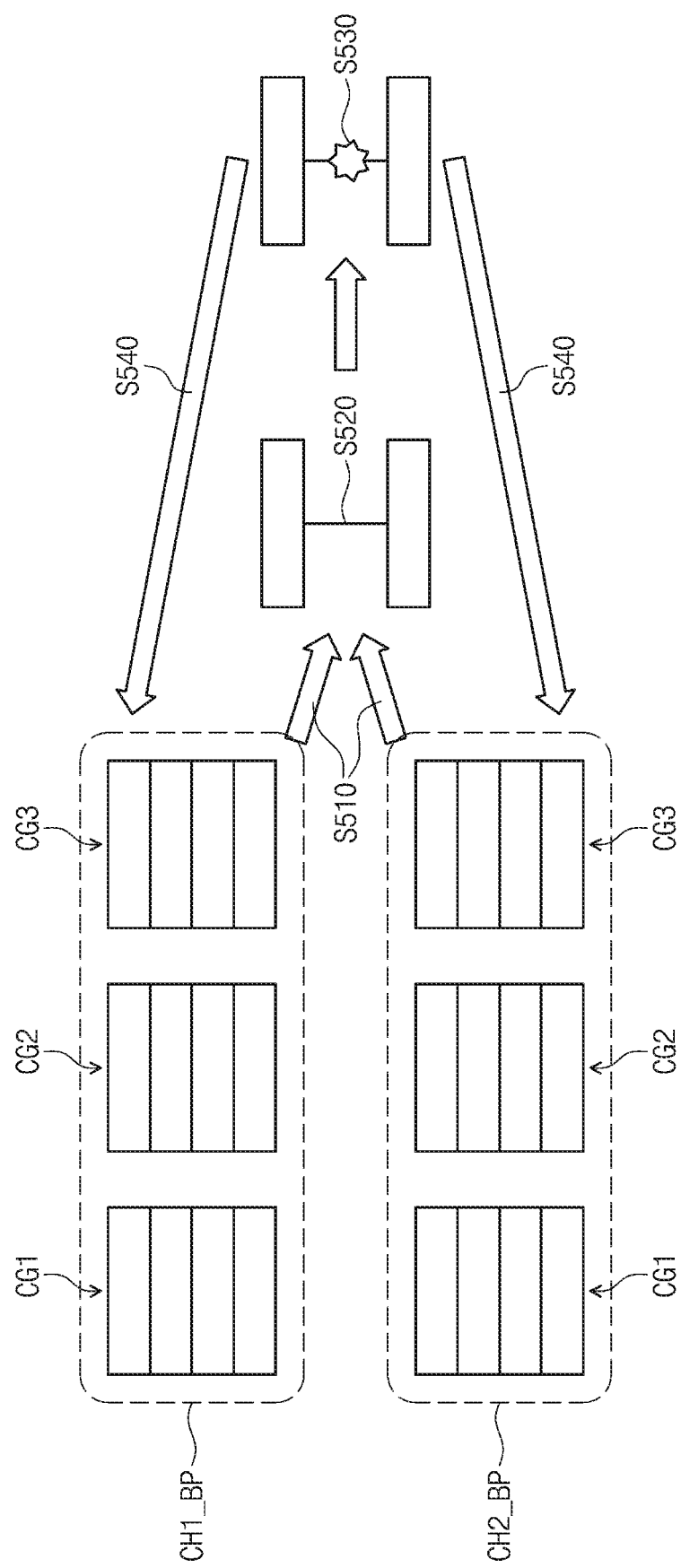
FIG. 11 is a diagram illustrating memory blocks being associated, according to an example embodiment.

FIG. 11 is a diagram illustrating memory blocks being associated, according to an example embodiment. Referring to FIGS. 1, 7, and 11, memory blocks, which are not being used, of memory blocks corresponding to the first channel CH1, for example, invalid blocks, erase blocks, or reserved blocks, may be managed in a first channel block pool CH1_BP. Memory blocks, which are not being used, of memory blocks corresponding to the second channel CH2, for example, invalid blocks, erase blocks, or reserved blocks, may be managed in a second channel block pool CH2_BP.

Memory blocks that are managed in the first channel block pool CH1_BP and the second channel block pool CH2_BP may be split into first to third characteristic groups CG1 to CG3, based on operating characteristics. Memory blocks of the first channel block pool CH1_BP and memory blocks of the second channel block pool CH2_BP may not be associated with each other.

In operation S510, the controller 120 generates a free block for writing new data. Because the first channel CH1 and the second channel CH2 are grouped to the super channel SCH, a memory block is selected in each of the first channel block pool CH1_BP and the second channel block pool CH2_BP. For example, memory blocks that belong to the same characteristic group may be selected in the first and second channel block pools CH1_BP and CH2_BP.

In operation S520, the controller 120 associates the selected memory blocks. The associated result may be written in memory blocks as the association information AI. Afterwards, write and read operations may be performed on the selected memory blocks.

Associated memory blocks may be invalidated or erased in process of time. When the invalidating or erasing of the associated memory blocks is performed, in operation S530, the controller 120 releases the association relationship between the associated memory blocks. Afterwards, in operation S540, the memory blocks of which the association relationship is released are returned to the first and second channel block pool CH1_BP and CH2_BP.

Figure 12:
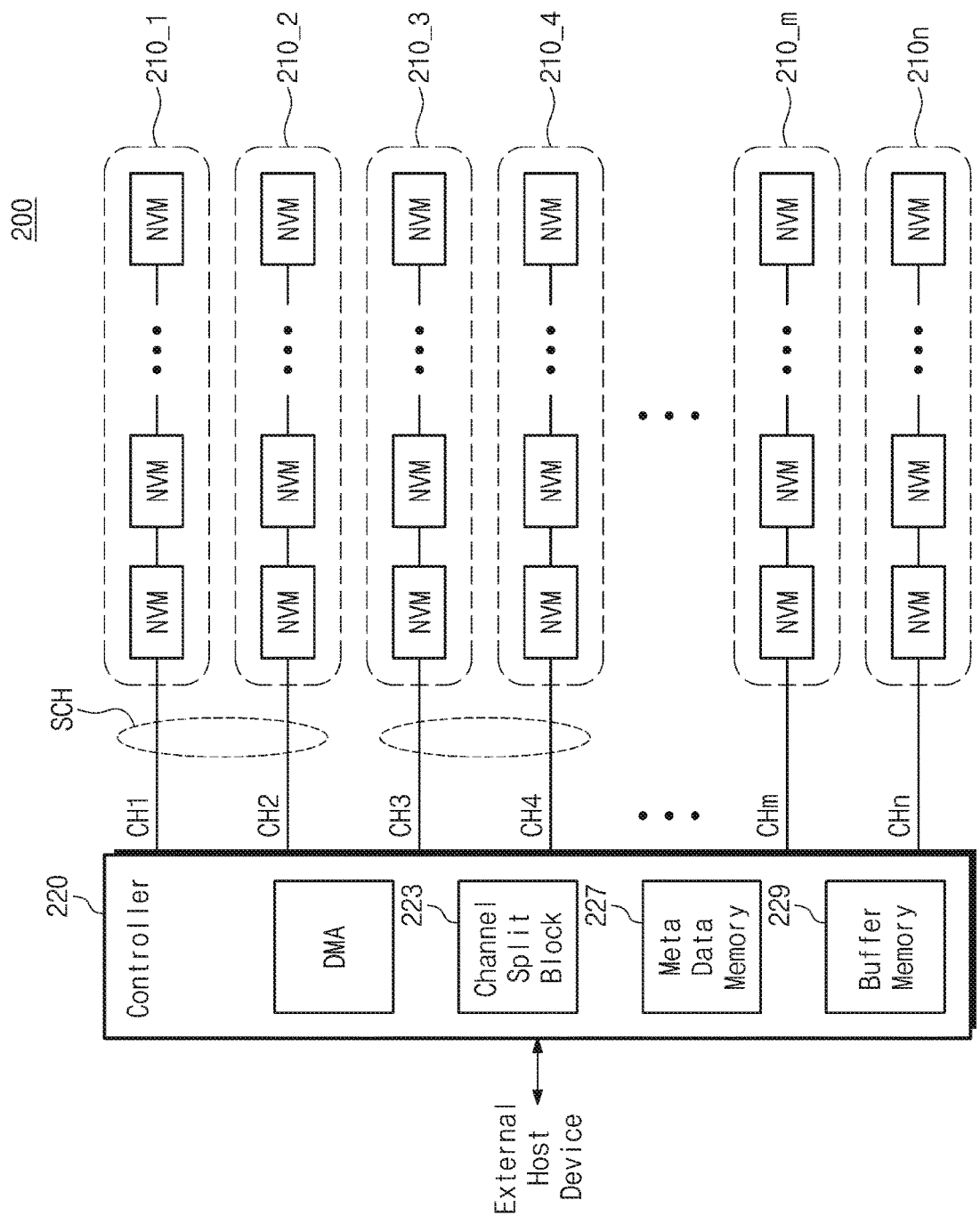
FIG. 12 is a block diagram illustrating an application of the storage device of FIG. 1.

FIG. 12 is a block diagram illustrating an application of the storage device 100 of FIG. 1. Referring to FIG. 12, a storage device 200 includes a plurality of nonvolatile memory devices NVM and a controller 220. The nonvolatile memory devices NVM may be split into a plurality of groups 210_1 to 210_n, based on a plurality of channels CH1 to CHn. The controller 220 includes a direct memory access DMA, a channel split block 223, a metadata memory 227, and a buffer memory 229.

Compared with those of FIG. 1, the first and second channels CH1 and CH2 and the third and fourth channels CH3 and CH4 are arranged as super channels SCH; on the other hand, the m-th and n-th channels CHm and CHn are not arranged as the super channel SCH. That is, some of the channels CH1 to CHn connected to the controller 220 may be arranged as the super channels SCH, and the remaining channels may not be arranged as the super channel SCH. The controller 220 may operate to be similar to the controller 120 described with reference to FIGS. 3 to 7.

Figure 13:
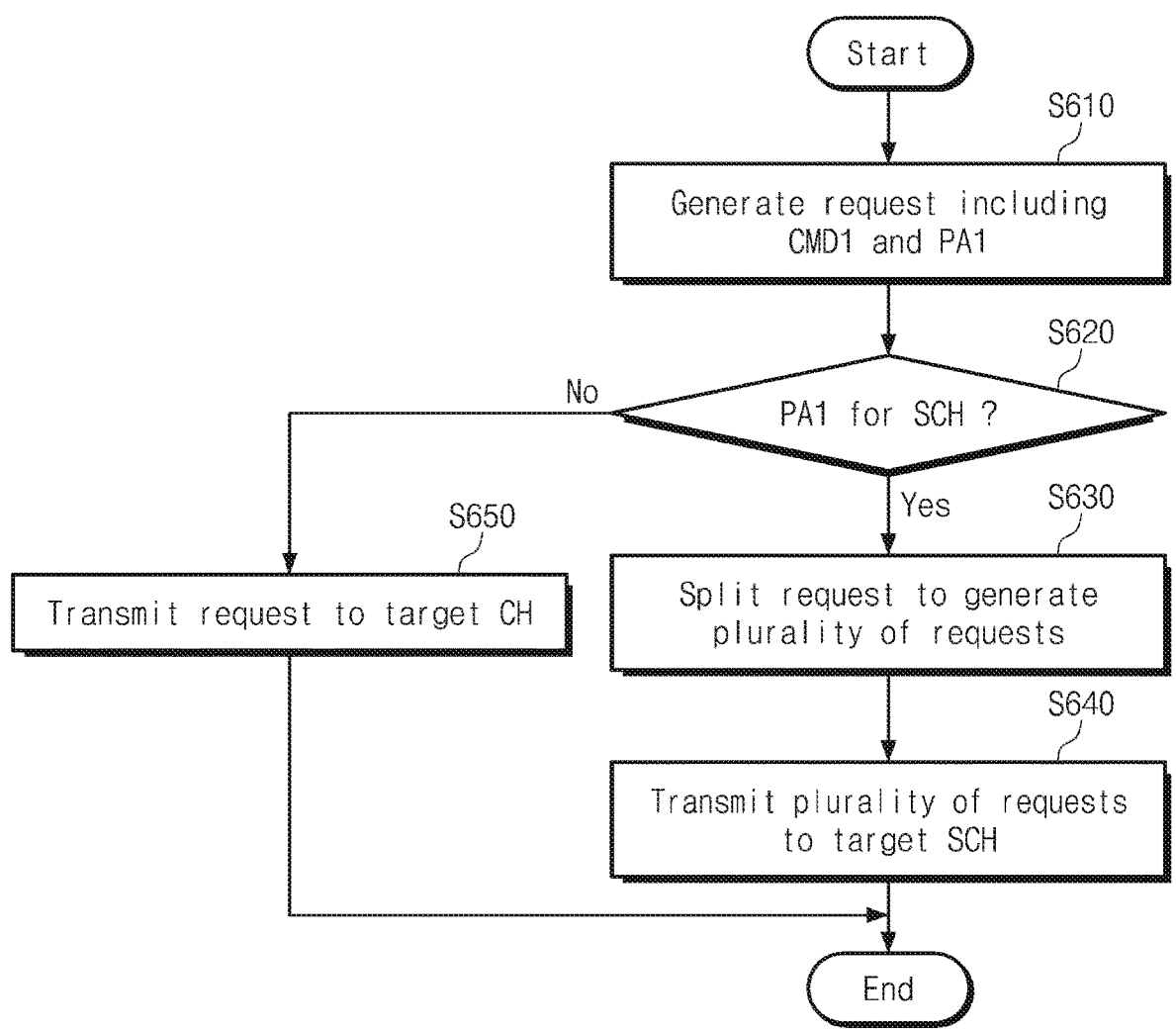
FIG. 13 is a flowchart illustrating an operating method of a storage device or a controller, according to an example embodiment.

FIG. 13 is a flowchart illustrating an operating method of the storage device 200 or the controller 220, according to an example embodiment. Referring to FIGS. 12 and 13, in operation S610, the controller 220 generates a first request including the first command CMD1 and the first physical address PA1.

In operation S620, the controller 220, for example, the channel split block 223, determines whether the first physical address PA1 is associated with or for the super channel SCH. If it is determined that the first physical address PA1 is not associated with the super channel SCH, in operation S650, the channel split block 223 transmits the first request to a target channel without splitting the first request. If it is determined that the first physical address PA1 is associated with the super channel SCH, the process proceeds to operation S630.

In operation S630, the channel split block 223 splits the first request to generate a plurality of second requests. In operation S640, the channel split block 223 transmits the second requests to channels of the target super channel SCH, respectively.

In the above-described example embodiments, components according to example embodiments are referred to by using the term "block.". The "block" may be implemented with various hardware devices, such as an integrated circuit, an application specific IC (ASIC), a field programmable gate array (FPGA), and a complex programmable logic device (CPLD), software, such as firmware and applications driven in hardware devices, or a combination of a hardware device and software.

Figure 14:
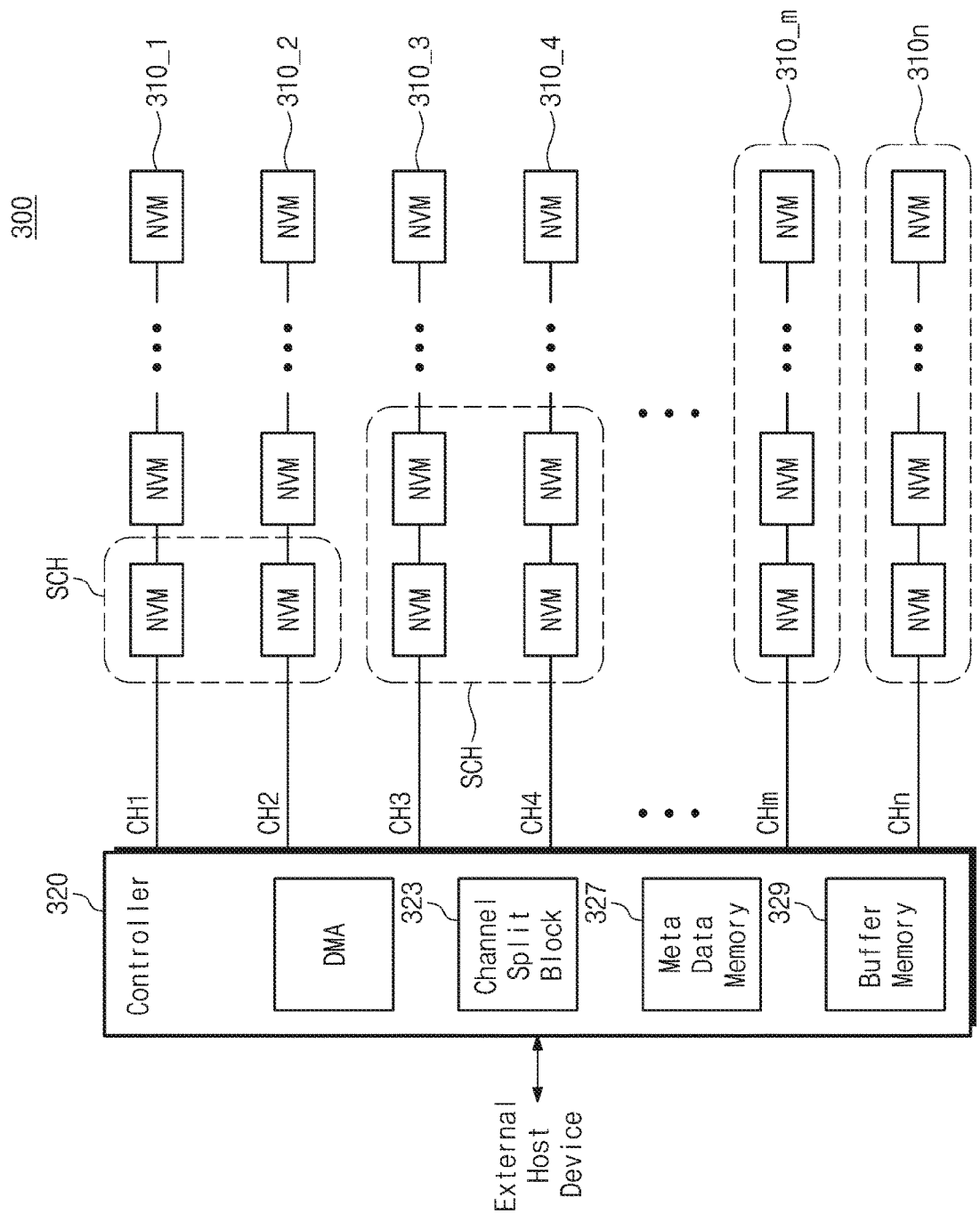
FIG. 14 is a block diagram illustrating an application of the storage device of FIG. 12.

FIG. 14 is a block diagram illustrating an application of the storage device 200 of FIG. 12. Referring to FIG. 14, a storage device 300 may include a plurality of nonvolatile memory devices NVM and a controller 320. The nonvolatile memory devices NVM may be split into a plurality of groups 310_1 to 310_n, based on a plurality of channels CH1 to CHn. The controller 320 includes a direct memory access DMA, a channel split block 323, a metadata memory 327, and a buffer memory 329.

Compared with those of FIG. 12, some of nonvolatile memory devices of first and second groups 310_1 and 310_2, for example, the first nonvolatile memory devices from a left side in FIG. 14, may be arranged as the super channel SCH based on the first and second channels CH1 and CH2. The remaining nonvolatile memory devices of the first and second groups 310_1 and 310_2 may not be arranged as the super channel SCH and may be respectively accessed through the first and second channels CH1 and CH2.

Some of nonvolatile memory devices of third and fourth groups 310_3 and 310_4, for example, the first and second nonvolatile memory devices from the left side in FIG. 14, may be arranged as the super channel SCH based on the third and fourth channels CH3 and CH4. The remaining nonvolatile memory devices of the third and fourth groups 310_3 and 310_4 may not be arranged as the super channel SCH and may be respectively accessed through the third and fourth channels CH3 and CH4. The controller 320 may operate to be similar to the controller 120 described with reference to FIGS. 3 to 7.

That is, in nonvolatile memory devices connected to the controller 320 through two or more channels, some of the nonvolatile memory devices may be arranged as a super channel based on the two or more channels. Accesses having an address targeting some of the nonvolatile memory devices may be processed based on the super channel (operation S630 and operation S640 of FIG. 13). The remaining nonvolatile memory devices may be individually accessed based on the two or more channels. Accesses having an address targeting the remaining nonvolatile memory devices may be processed based on individual channels (operation S650 of FIG. 13).

Figure 15:
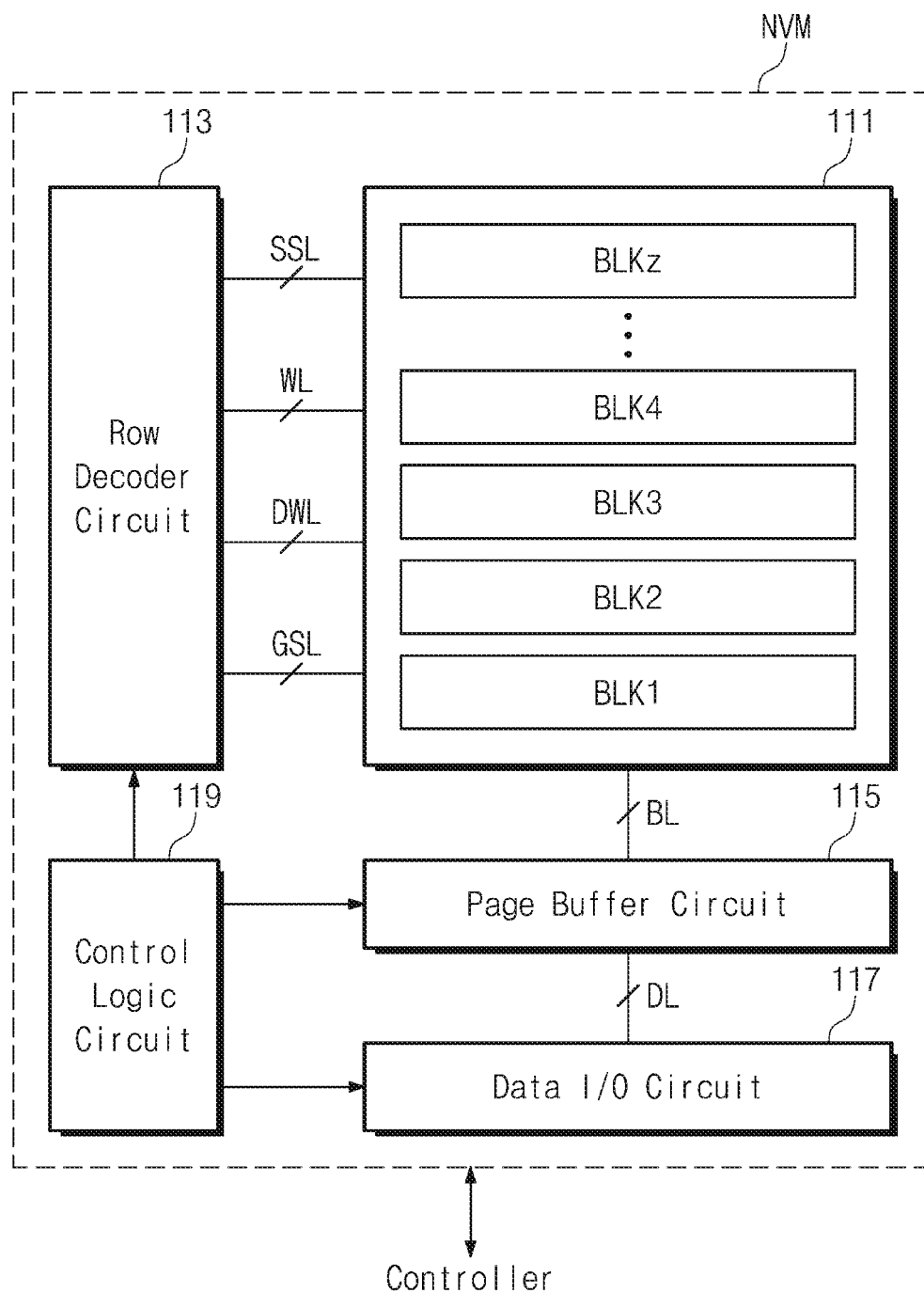
FIG. 15 is a block diagram illustrating a nonvolatile memory device, according to an example embodiment.

FIG. 15 is a block diagram illustrating a nonvolatile memory device NVM, according to an example embodiment. Referring to FIG. 15, the nonvolatile memory device NVM includes a memory cell array 111, a row decoder circuit 113, a page buffer circuit 115, a data input/output (I/O) circuit 117, and a control logic circuit 119.

The memory cell array 111 includes a plurality of memory blocks BLK1 to BLKz. Each of the memory blocks BLK1 to BLKz includes a plurality of memory cells. Each of the memory blocks BLK1 to BLKz may be connected to the row decoder circuit 113 through at least one ground selection line GSL, a plurality of word lines WL, a plurality of dummy word lines DWL, and at least one string selection line SSL. Each of the memory blocks BLK1 to BLKz may be connected to the page buffer circuit 115 through a plurality of bit lines BL. The memory blocks BLK1 to BLKz may be connected in common to the bit lines BL. The memory cells of the memory blocks BLK1 to BLKz may have the same structure.

In an example embodiment, each of the memory blocks BLK1 to BLKz may correspond to a unit of an erase operation. The memory cells of the memory cell array 111 may be erased in units of a memory block. The memory cells belonging to a memory block may be erased at the same time. As another example, each of the memory blocks BLK1 to BLKz may be divided into a plurality of sub-blocks. Each sub-block may correspond to a unit of an erase operation.

The row decoder circuit 113 is connected to the memory cell array 111 through a plurality of ground selection lines GSL, the plurality of word lines WL, the plurality of dummy word lines DWL, and a plurality of string selection lines SSL. The row decoder circuit 113 operates according to control of the control logic circuit 119. The row decoder circuit 113 may decode an address received from a controller 120 (refer to FIG. 1) through an input/output channel and may control voltages to be applied during a program, read, or erase operation to the string selection lines SSL, the word lines WL, the dummy word lines DWL, and the ground selection lines GSL based on the decoded address.

The page buffer circuit 115 is connected to the memory cell array 111 through the bit lines BL. The page buffer circuit 115 is connected to the data input/output circuit 117 through a plurality of data lines DL. The page buffer circuit 115 is controlled by the control logic circuit 119. During the program operation, the page buffer circuit 115 may store data to be programmed in memory cells. The page buffer circuit 115 may apply voltages to the bit lines BL, based on the stored data. During the read operation or a verification read operation, the page buffer circuit 115 may sense voltages of the bit lines BL and may store the sensed result.

The data input/output circuit 117 is connected with the page buffer circuit 115 through the data lines DL. The data input/output circuit 117 may output data, which is read by the page buffer circuit 115, to the controller 120 through the input/output channel, and may transfer data, which is received from the controller 120 through the input/output channel, to the page buffer circuit 115.

The control logic circuit 119 may receive a command from the controller 120 through the input/output channel, and may receive a control signal therefrom through a control channel. The control logic circuit 119 may decode the received command, and may control the nonvolatile memory device NVM, based on the decoded command. For example, the control logic circuit 119 may control the nonvolatile memory device NVM to perform the program, read or erase operation.

Figure 16:
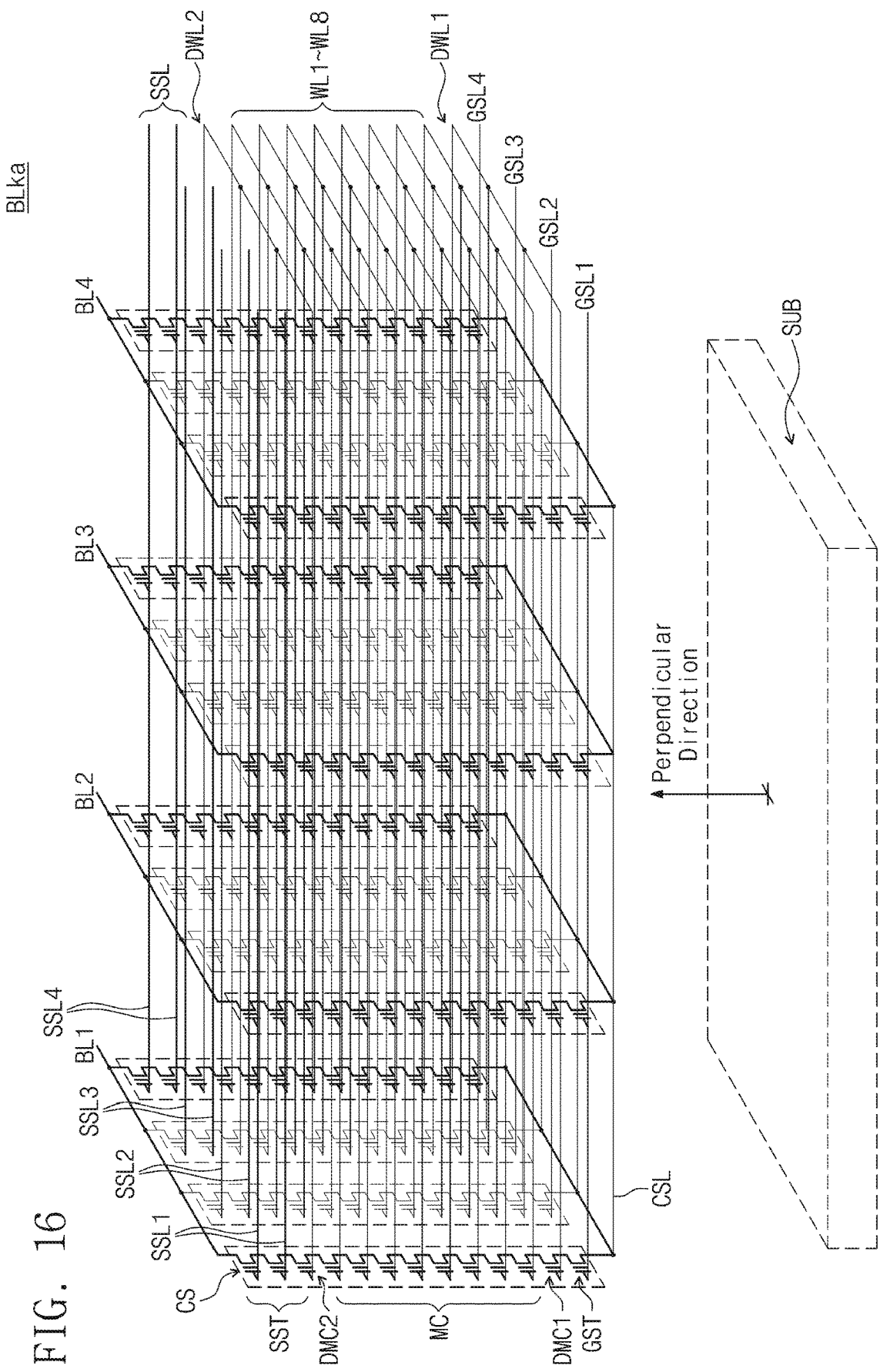
FIG. 16 is a diagram illustrating a memory block, according to an example embodiment.

FIG. 16 is a diagram illustrating a memory block BLKa, according to an example embodiment. Referring to FIG. 16, a plurality of cell strings CS are arranged on a substrate SUB in rows and columns. The cell strings CS are connected in common to a common source line CSL that is formed on (or in) the substrate SUB. In FIG. 16, a location of the substrate SUB is exemplified to help understand a structure of the memory block BLKa. An example embodiment is exemplified in FIG. 16 as the common source line CSL is connected to lower ends of the cell strings CS. However, it does not matter if the common source line CSL is electrically connected to the lower ends of the cell strings CS. However, example embodiments may not be limited to the case that the common source line CSL is physically located at the lower ends of the cell strings CS. An example embodiment is exemplified in FIG. 16 as the cell strings CS are arranged in a four-by-four matrix. However, the number of cell strings CS in the memory block BLKa may increase or decrease.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be light.

Each cell string CS may include at least one ground selection transistor GST connected to the corresponding ground selection line, a plurality of memory cells MC respectively connected to a plurality of word lines WL1 to WL8, and string selection transistors SST connected to the corresponding string selection line SSL1 or SSL2. In each cell string CS, the ground selection transistor GST, the memory cells MC, and the string selection transistor SST may be serially connected to each other along a direction perpendicular to the substrate SUB, and may be sequentially stacked along a direction perpendicular to the substrate SUB.

In an example embodiment, in each cell string CS, one or more dummy memory cells (e.g., DMC1 and DMC2) may be arranged between the ground selection transistor GST and the memory cells MC, and may be respectively connected to one or more dummy word lines (e.g., DWL1 and DWL2). In each cell string CS, one or more dummy memory cells may be arranged between the string selection transistors SST and the memory cells MC. In each cell string CS, one or more dummy memory cells may be arranged between the memory cells MC. The dummy memory cells may have the same structure as the memory cells MC and may not be programmed (e.g., program inhibited) or may be programmed differently from the memory cells MC. For example, when memory cells are programmed to form two or more threshold voltage distributions, the dummy memory cells may be programmed to have one threshold voltage distribution range.

Memory cells of the cell strings CS that are arranged at the same height (or order) from the substrate SUB or the ground selection transistor GST may be electrically connected to each other. Memory cells of the cell strings CS that are arranged at different heights (or orders) from the substrate SUB or the ground selection transistor GST may be electrically separated from each other. An example embodiment in FIG. 16 includes memory cells of the same height are connected to the same word line. However, the memory cells of the same height may be directly connected to each other in a plane where the memory cells are formed or may be indirectly connected to each other through another layer such as a metal layer.

The memory block BLKa may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an example embodiment, the 3D memory array includes vertical NAND strings (or cell strings) that are vertically oriented such that at least one memory cell is located over another memory cell. The at least one memory cell may include a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

According to example embodiments, an access request corresponding to an address of a unit length is split to data requests of which the amount is smaller than that of data corresponding to the unit length, and the data requests are scattered into a plurality of channels. Accordingly, a storage device and a controller for reducing a direct memory access time and improving a speed are provided.

As is traditional in the field, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the example embodiments. Further, the blocks, units and/or modules of the example embodiments may be physically combined into more complex blocks, units and/or modules without departing from the scope of the example embodiments.

It will be apparent to those skilled in the art that various changes and modifications may be made without departing from the spirit and scope of the example embodiments. Therefore, it is understood that the above example embodiments are not limiting, but illustrative.

What is claimed is:

1. A storage device comprising:
a first nonvolatile memory device;
a second nonvolatile memory device; and
a controller connected to the first nonvolatile memory device through a first channel and to the second nonvolatile memory device through a second channel,
wherein in response to receiving a request and a logical address, the controller is configured to:
generate a first physical address based on the logical address and generate a plurality of second physical addresses based on the first physical address,
generate a plurality of second commands from a first command corresponding to the first physical address, and
transmit the plurality of second commands and the plurality of second physical addresses to at least one from among the first nonvolatile memory through the first channel and the second nonvolatile memory through the second channel.

2. The storage device of claim 1, wherein the first nonvolatile memory device includes a plurality of first memory blocks,
wherein the second nonvolatile memory device includes a plurality of second memory blocks, and
wherein the controller is further configured to associates each of the plurality of first memory blocks to each of the plurality of second memory blocks.

3. The storage device of claim 2, wherein the first physical address and at least one of the plurality of second physical addresses are same except for block addresses.

4. The storage device of claim 2, wherein the first physical address and at least one of the plurality of second physical addresses are at least partly same each other.

5. The storage device of claim 2, wherein the first physical address and at least one of the plurality of second physical addresses are at least partly different each other.

6. The storage device of claim 1, wherein a split length of each of the plurality of second physical addresses is smaller than a unit length of the first physical address.

7. The storage device of claim 2, wherein the controller stores information of association of each of the plurality of first memory blocks and each of the plurality of second memory blocks into at least one of the first nonvolatile memory device or the second nonvolatile memory device.

8. The storage device of claim 2, wherein each of the plurality of first memory blocks and the plurality of second memory blocks stores information indicating a corresponding memory block associated.

9. The storage device of claim 1, further comprising:
a third nonvolatile memory device connected to the controller through a third channel,
wherein the controller transmit the first command and the first physical address to the first nonvolatile memory through the first channel, and transmit one of the plurality of second commands and one of the plurality of second physical addresses to the second nonvolatile memory device through the second channel when the logical address corresponds to one of the first nonvolatile memory device and the second nonvolatile memory device.

10. The storage device of claim 9, wherein in response to receiving a second request and a second logical address, the controller is configured to generate a third physical address based on the second logical address and transmit a third command and the third physical address to the third nonvolatile memory device when the second logical address corresponds to the third nonvolatile memory device.

11. The storage device of claim 9, further comprising:
a fourth nonvolatile memory device connected to the controller through a fourth channel,
wherein in response to receiving a second request and a second logical address, the controller is configured to generate a third physical address and a fourth physical address based on the second logical address, transmit a third command and the third physical address to the third nonvolatile memory through the third channel, and transmit a fourth command and the fourth physical address to the fourth nonvolatile memory device through the fourth channel when the second logical address corresponds to one of the third nonvolatile memory device and the fourth nonvolatile memory device.

12. The storage device of claim 1, further comprising:
a third nonvolatile memory device connected to the first channel; and
a fourth nonvolatile memory device connected to the second channel,
wherein in response to receiving a second request and a second logical address, the controller is configured to generate a third physical address and a fourth physical address based on the second logical address, transmit a third command and the third physical address to the third nonvolatile memory through the first channel, and transmit a fourth command and the fourth physical address to the fourth nonvolatile memory device through the second channel when the second logical address corresponds to one of the third nonvolatile memory device and the fourth nonvolatile memory device.

13. The storage device of claim 1, further comprising:
a third nonvolatile memory device connected to the first channel,
wherein in response to receiving a second request and a second logical address, the controller is configured to generate a third physical address based on the second logical address and transmit a third command and the third physical address to the third nonvolatile memory through the first channel when the second logical address corresponds to the third nonvolatile memory device.

14. A method of operating a storage device including a first nonvolatile memory device, a second nonvolatile memory device and a controller, the method comprising:
receiving a request and a logical address from an external device;
generating a first physical address based on the logical address and generating a plurality of second physical addresses based on the first physical address;
generating a plurality of second commands from a first command corresponding to the first physical address, and
transmitting the plurality of second commands and the plurality of second physical addresses to at least one from among the first nonvolatile memory through the first channel and the second nonvolatile memory through the second channel.

15. The method of claim 14, in response to the request being a write request, further comprising:
receiving data from the external device;
splitting the data into first data and second data;
transmitting the first data to the first nonvolatile memory device through the first channel; and
transmitting the second data to the second nonvolatile memory device through the second channel.

16. The method of claim 15, further comprising:
performing error correction encoding on the first data before transmitting the first data; and
performing error correction encoding on the second data before transmitting the second data.

17. The method of claim 14, in response to the request being a read request, further comprising:
reading first data from the first nonvolatile memory device through the first channel in response to the first command;
reading second data from the second nonvolatile memory device through the second channel in response to the second command; and
outputting data including the first data and the second data to the external device.

18. The method of claim 17, further comprising:
performing error correction decoding on the first data before outputting the data; and
performing error correction decoding on the second data before outputting the data.

19. A storage device comprising:
a plurality of nonvolatile memory device;
a plurality of channels connected to the plurality of nonvolatile memory devices, each channel being connected to at least one nonvolatile memory device among the plurality of nonvolatile memory device; and
a controller connected to at least two first nonvolatile memory devices, among the plurality of nonvolatile memory device, through a first super channel, the first super channel including at least two first channels among the plurality of channels, and connected to at least two second nonvolatile memory devices, among the plurality of nonvolatile memory device, through a second super channel, the second super channel including at least two second channels among the plurality of channels,
wherein the controller is configured to access the first super channel and the second super channel individually, access the at least two first channels belong to the first super channel simultaneously, and access the at least two second channels belong to the second super channel simultaneously.

20. The storage device of claim 19, wherein the controller is connected to at least one nonvolatile memory device, among the plurality of nonvolatile memory devices, through a channel among the plurality of channels, and configured to access the channel individually.

* * * * *